United States Patent [19]

Moran

[11] 4,203,030
[45] May 13, 1980

[54] METHOD AND STRUCTURE FOR DETECTING RECYCLING OF POLYNOMIAL COUNTERS

[75] Inventor: John C. Moran, Glen Ellyn, Ill.

[73] Assignee: Bell Telephone Laboratories, Incorporated, Murray Hill, N.J.

[21] Appl. No.: 953,831

[22] Filed: Oct. 23, 1978

[51] Int. Cl.$^2$ .................. G11C 19/00; H03K 21/00
[52] U.S. Cl. .......................... 235/92 CC; 235/92 PE; 235/92 SH; 307/221 R; 328/37; 328/48
[58] Field of Search ......... 235/92 CC, 92 PE, 92 SH; 307/221 R, 293; 328/37, 48, 129

[56] References Cited

U.S. PATENT DOCUMENTS

| | | | |
|---|---|---|---|
| 2,951,230 | 8/1960 | Cadden | 307/221 R |
| 2,970,226 | 1/1961 | Skelton et al. | 307/293 |
| 3,818,354 | 6/1974 | Tomisawa et al. | 328/48 |
| 3,849,635 | 11/1974 | Freedman | 235/92 PE |
| 3,911,330 | 10/1975 | Fletcher et al. | 307/221 R |
| 3,959,731 | 5/1976 | Pomerantz et al. | 328/129 |
| 3,978,413 | 8/1976 | Frohwerk | 307/221 R |
| 3,982,192 | 9/1976 | Newton et al. | 328/129 |
| 4,034,156 | 7/1977 | Willmore | 235/92 SH |
| 4,143,327 | 3/1979 | Welsh | 328/48 |

Primary Examiner—Leo H. Boudreau
Attorney, Agent, or Firm—Jerry W. Herndon

[57] ABSTRACT

The use of polynomial counters is desirable whenever large counts are required such as in long-interval timers, microprocessors and the like. Determining when such a counter recycles, however, presents a problem because of the large number of stages required and the fact that polynomial counters do not have an overflow, or carry, output. This problem is solved by method and structure in an arrangement comprising a polynomial counter having a prescribed number N of counting stages and $2^N-1$ count states and a source of pulses for incrementing the polynomial counter. During counting operations, an indication is stored when a prescribed one of the stages of the polynomial counter assumes a predetermined logic state. The indication is cleared after each group of N of the pulses. A count complete signal, indicating that the polynomial counter has recycled, is generated after the occurrence of a group of N pulses of the indication is not then stored.

7 Claims, 3 Drawing Figures

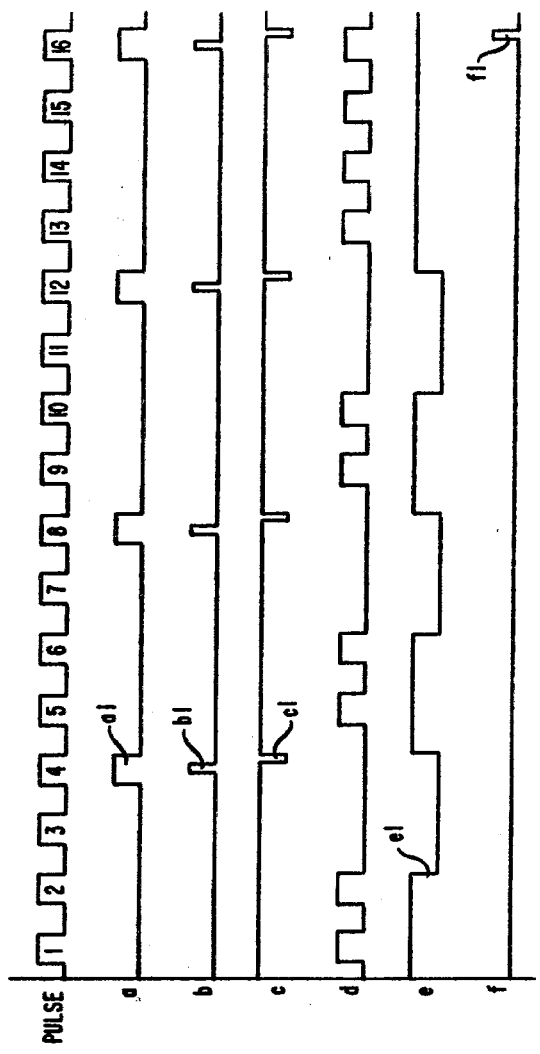

METHOD AND STRUCTURE FOR DETECTING RECYCLING OF POLYNOMIAL COUNTERS

TECHNICAL BACKGROUND

In many counting, timing and similar operations, it is often necessary to detect a particular count state of a counter on which is predicated the activation of some event. For example, to generate accurately a time delay function, a typical method is to count in a counter regularly occurring pulses and to detect a particular count state, such as "all zero", in the stages of the counter. The pulse rate and the number of count states between the beginning and detected count states determine the length of the time interval generated.

In instances in which large counts are involved, it is often desirble to use polynomial counters. A polynomial counter is one in which the logic state assumed by an initial stage of the counter responsive to each pulse to be counted is jointly determined by the then existing logic states of at least two other prescribed stages of the counter. The logic states assumed by the remaining stages of the counter responsive to each counted pulse is simply the state of the immediately preceding stage. Because of these attributes, polynomial counters are usually implemented by shift registers and the count states through which a polynomial counter progresses as pulses are counted do not form a binary progression in the base 2 numerical system as is the case with, for example, ripple counters.

It is desirable to use such shift register polynomial counters where the number of counter stages is large because of the ease and economy of fabrication of shift registers by integrated circuit techniques. Generally, such counters require about half the number of circuit elements as conventional flip-flop counters.

It is relatively easy to determine when a desired count state has occurred when ripple or other types of counters are used which have overflow, or carry, outputs. Typically, a recycling counter is used which has precisely the number of count states required to measure or generate the desired function. A recycling counter is one which automatically returns to its beginning count state in the process of counting pulses after it has progressed through all of its count states. When the counter recycles, an overflow, or carry signal, is generated and used as an indication of the attainment of the desired count state. This technique is not applicable to polynomial counters, however, because of the lack of an overflow signal. The inability to provide an overflow signal in a polynomial counter is caused by the fact that the state of each successive stage of the counter, except the initial stage, is determined only by the immediately preceding stage, as will be seen.

In other instances, a desired count state is detected by examining all stages of a counter for the appropriate logic states which together define the desired count. This technique, however, although applicable to counters having any type of state progression, becomes increasingly cumbersome and expensive as the number of counter stages increases. This is because of the additional circuitry required to decode the logic state of each of the counter stages. Indeed, in counters involving sufficiently large numbers of stages, the additional decoding circuitry may become the dominant portion of the overall circuit.

SUMMARY OF THE INVENTION

The problem of economically and conveniently detecting the recycling of polynomial counters is solved by method and structure in an arrangement comprising a polynomial counter having a prescribed number N of counting stages and $2^N - 1$ count states and a source of pulses for incrementing the polynomial counter. During counting operations, an indication is stored when a prescribed one of the stages of the polynomial counter assumes a predetermined logic state. The indication is cleared after each group of N of the pulses. A count complete signal, indicating that the polynomial counter has recycled, is generated after the occurrence of one of the groups of N pulses and before the indication is cleared if the indication is not then stored.

Structure for implementing the method comprises a second counter having only N count states. The second counter is incremented by the pulses which also increment the polynomial counter. The second counter generates an overflow (or carry) signal each time it recycles through its N count states. Other circuit means is jointly responsive to the overflow signals and to the absence of a predetermined logic state in the prescribed one of the counting stages of the polynomial counter since the last overflow signal from the second counter to generate the count complete signal.

In one preferred embodiment, an indication is stored each time the prescribed one of the stages of the polynomial counter assumes the predetermined logic state. The indication is cleared each time the second counter recycles through its N count states. A count complete signal is generated when the second counter recycles and the indication is not then stored.

The prescribed stage of the polynomial counter in the preferred embodiment is the initial stage whose logic state responsive to each counting pulse is determined jointly by the logic states of other prescribed ones of the stages of the polynomial counter.

The invention is particularly useful with large polynomial counters, which are easily and inexpensively fabricated, and avoids the necessity of providing circuitry otherwise required for decoding the logic states of each of the counter stages to detect a desired count state. The invention thus has particular application whenever lengthy timing intervals are to be generated or large numbers are to be counted. For example, a one-year timer might be implemented using a 35-stage polynomial counter incremented at an approximate 1000 hertz per second rate from an "all zero" beginning count state to the next occurrence of the "all zero" count state. To detect the final "all zero" count state of such a counter by conventional techniques requires a relatively large matrix of logic gates. With my invention, however, the only circuitry required is a constant small number of circuit elements and an additional counter having 6 stages, 35 count states, and an overflow, of carry, output. Moreover, because a 6-stage counter has 64 potential count states, the 6-stage counter is sufficient to operate with a polynomial counter having up to 64 counting stages. For polynomial counters having from 65 to 128 counting stages, a 7 stage second counter is required, and so on.

BRIEF DESCRIPTION OF THE DRAWING

In the drawing,

FIG. 2 is a logic truth table of the counting states of an illustrative 4-stage polynomial counter; and FIG. 3 shows a sequence of pulse waveforms at selected nodes of the circuit of FIG. 1 which aid the understanding of the operation of the circuit.

DETAILED DESCRIPTION

Figure 1:
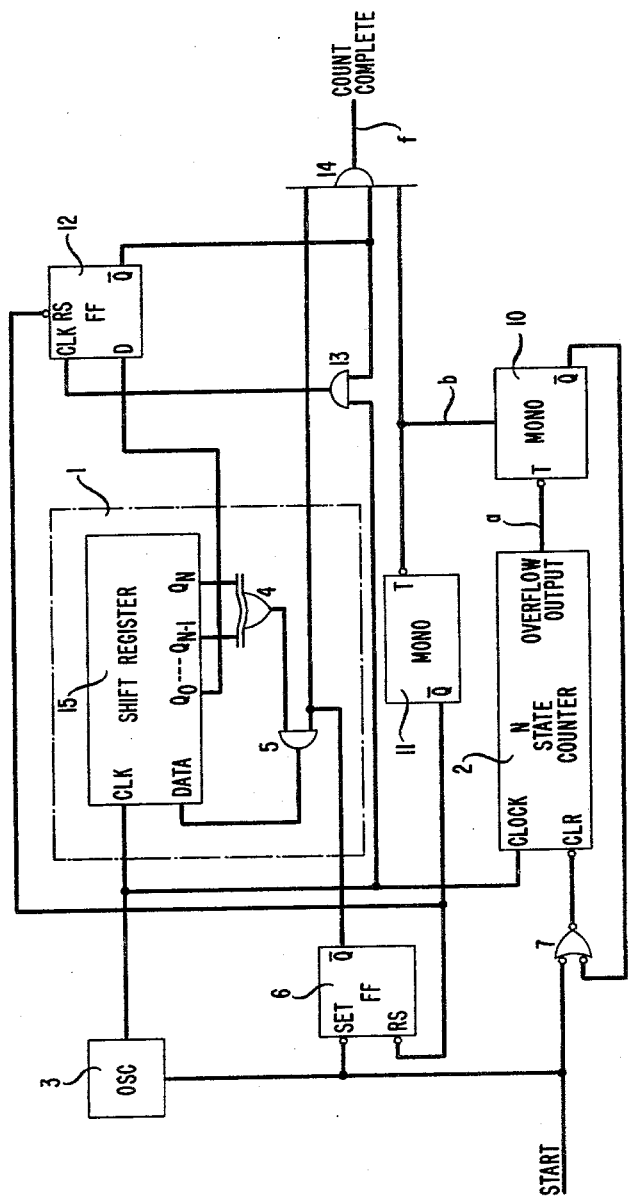
FIG. 1 is a circuit diagram of one illustrative preferred embodiment of the invention used in a long-term interval timer.

In the illustrative long-term interval timer of FIG. 1, a polynomial counter 1 and a second counter 2 are incremented by pulses from an oscillator 3. Polynomial counter 1 comprises an N stage shift register 15, EXCLUSIVE NOR gate 4 and AND gate 5, and is assumed, for purposes of discussion, to have N counting stages and $2^N-1$ counting states. In the remainder of this discussion, the stages of shift register 15 are referred to as stages of the polynomial counter. Counter 2 has N counting states and may be a ripple, synchronous or any other type of desired counter having an overflow output.

The operation of polynomial counters is described in detail in U.S. Pat. No. 2,951,230, which issued to W. C. Cadden on Aug. 30, 1960. Briefly, the operation of polynomial counter 1 is as follows. The logic states of the final stages $Q_N$ and $Q_{N-1}$ of counter 1 are inputs to the EXCLUSIVE NOR gate 4 whose output is returned to the input of an initial stage $Q_0$ of the counter via AND gate 5. Assuming that gate 5 is enabled to its lower input, each time counter 1 is activated by a pulse from oscillator 3, the logic state assumed by stage $Q_0$ is determined by the logic states of stages $Q_N$ and $Q_{N-1}$. Specifically, the output of EXCLUSIVE NOR gate 4 is a "1", or a high state, whenever the logic states of $Q_N$ and $Q_{N-1}$ are identical and a "0", or a low state, whenever the logic states of these two stages are dissimilar. The remaining stages $Q_1$ to $Q_N$ of the counter operate as a conventional shift register and each stage merely assumes the logic state of the immediately preceding stage in response to each pulse.

The general principles of operation of my preferred method and structure may be readily understood by examining the truth table of FIG. 2. In FIG. 2, the number of stages N of polynomial counter 1 is assumed to be equal to 4, which is also the number of assumed count states of counter 2. The sequential count states of counter 1 may be viewed as divided into groups of N, or 4, states as delineated by the lines drawn in the truth table after pulse states 3, 7, 11 and 15. In a counting cycle in which the beginning count state is "all zero", as is the case in FIG. 2, it is observed that the initial stage $Q_0$ of counter 1 assumes the logic state "1" at least once during each of the groups except the final group corresponding to pulses 12 to 15 which occur immediately prior to recycling of counter 1. This relationship remains true regardless of the number of stages of the counter so long as the counter has a counting cycle consisting of $2^N-1$ count states. Thus, it is possible to determine when such a counter has progressed through all of its count states and recycled by monitoring the logic state of the initial stage during each ordered group of N pulses. In the preferred embodiment to be described, an indication is stored whenever the initial stage $Q_0$ assumes the logic state "1". The occurrence of each group of N count states of counter 1 is determined by counting pulses in a second small counter as well as in the polynomial counter and the stored indication is cleared after each group of N states. The polynomial counter has recycled whenever at the completion of a group of N states the indication has not been stored during the group.

In the circuit of FIG. 1, flip-flop 12 is set during each group of N states if stage $Q_0$ of polynomial counter 1 assumes the logic state "1" during the group. Counter 2 generates an overflow signal each time it counts N pulses. This occurs in response to pulses 4, 8, 12 and 16 in FIG. 2. Note that counter 1 recycles at pulse 15 in FIG. 2. Each overflow signal from counter 2 causes monostable flip-flops 10 and 11 to reset flip-flop 12. Monostables 10 and 11 may be Texas Instrument, Inc. devices such as the SN74121 or any other type of similar conventional device. Monostable 10 also partially enables output gate 14 for a brief interval in response to each overflow signal. Gate 14 generates a COUNT COMPLETE signal when it is fully enabled. Gate 14, however, is disabled at the time of occurrence of each overflow signal by the set state of flip-flop 12, with the exception of the next overflow signal to occur after polynomial counter 1 recycles. This overflow signal occurs at pulse 16 in FIG. 2. During the final group of count states during which counter 1 recycles, the logic state of $Q_0$ remains "0" and flip-flop 12 is never set. The overflow signal generated by monostable 10 at pulse 16 in FIG. 2, therefore fully enables gate 14 and this generates the COUNT COMPLETE signal.

The operation of the circuit of FIG. 1 is initiated by a low-going pulse on lead START which sets flip-flop 6 and activates oscillator 3. The low-going pulse also clears counter 2 via logic gate 7. As a result of the START signal, oscillator 3 begins generating clock pulses at a prescribed rate and these clock pulses are directed to the CLOCK inputs of both polynomial counter 1 and counter 2. Initially, the clock pulses have no effect on the count state of polynomial counter 1 because flip-flop 6 is set and its $\overline{Q}$ output extended to one input of gate 5 is low, causing gate 5 to apply only a "0" signal to the DATA input of counter 1. Counter 2, however, counts the clock pulses at this time and produces at its OVERFLOW output an overflow pulse when the $N^{th}$ clock pulse from oscillator 3 is counted. This is illustrated by pulse a1 in waveform a of FIG. 3 for a counter 2 having 4 states. The trailing edge of the overflow pulse operates monostable 10 which, in turn, generates a delayed pulse on its Q output as illustrated by pulse b1 in waveform b of FIG. 3; this pulse, in turn, operates monostable 11 to produce a negative-going pulse on its $\overline{Q}$ output, as shown by pulse c1 of waveform c of FIG. 3. This negative-going pulse is extended to the RS input of flip-flop 6 to reset it to the "0" state. As a result, the $\overline{Q}$ output of flip-flop 6 assumes a high state and enables AND gate 5. Beginning with pulse N+1, therefore, polynomial counter 1 begins to count clock pulses from oscillator 3 in a fashion similar to that illustrated by the truth table of FIG. 2. Counter 2 also continues to count the oscillator 3 pulses and to recycle and generate an overflow signal to operate monostables 10 and 11 after every $N^{th}$ pulse. Waveform a of FIG. 3 shows the overflow pulses that occur at every $4^{th}$ clock pulse at the OVERFLOW output of counter 2 for the example of N equal to 4. Waveforms b and c show the output pulses generated by monostables 10 and 11, respectively, in response to the overflow signals.

The logic state of stage $Q_0$ of polynomial counter 1 is extended to the D input of flip-flop 12. The flip-flop is clocked by an output from AND gate 13, which has as inputs the pulses from oscillator 3 and the $\overline{Q}$ output of flip-flop 12 and the flip-flop assumes the state present at the D input at the occurrence of the clock pulse. Flip-flop 12 is assumed to have been reset when the pulse on lead START was received. Initially, the resulting high state on its $\overline{Q}$ output enables AND gate 13 to pass clock pulses from oscillator 3 to the CLOCK input of flip-flop 12. When stage $Q_0$ of polynomial counter 1 becomes "1", the next pulse from oscillator 3 sets flip-flop 12 which, in turn, disables gate 13 because of the low signal on its $\overline{Q}$ output. The set state of flip-flop 12, once it occurs, remains until the flip-flop is reset by monostable 11 as a result of an overflow pulse from counter 2.

In FIG. 3, waveform e shows the state of the $\overline{Q}$ output of flip-flop 12. Initially it is "1" as shown at e1, allowing clock pulses 1 and 2 to be gated by gate 13 to the CLK input of flip-flop 12. The trailing edge of clock pulse 2 resets flip-flop 12 becuase stage $Q_0$ assumed a "1" logic state after the occurrence of clock pulse 1. Gate 5 is then disabled by the flip-flop which remains set until the occurrence of an overflow signal from counter 2 responsive to clock pulse 4. Similar operations occur during each group of N states.

The $\overline{Q}$ output of flip-flop 12 is extended to one input of AND gate 14 and disables this gate during the time that the flip-flop is set. Gate 14 also has an input from monostable 10 to generate a COUNT COMPLETE signal responsive to an overflow pulse from counter 2.

As discussed above, the $Q_0$ stage of counter 1 assumes a "1" state at least once in each group of its N count states with the exception of the last group of count states during which polynomial counter 1 recycles. Flip-flop 12 is therefore set, during each group of N count states, with the exception of the final group. Gate 14 is therefore disabled by flip-flop 12 at the time of occurrence of all the overflow signals except the overflow signal occurring after counter 1 recycles. This would be the overflow signal occurring in response to pulse 16 in FIG. 2. This overflow signal from monostable 10 completely enables gate 14 to generate the COUNT COMPLETE output signal signifying the expiration of the time interval as shown by pulse f1 in waveform f of FIG. 3. This COUNT COMPLETE signal may be used to deactivate the operation of oscillator 3 and to reset all storage devices of the circuit to prepare it for future operation, if desired.

The total time interval generated by the illustrative circuit of FIG. 1 is equal to the time of generation of the first N clock pulses from oscillator 3 during which time gate 5 is disabled and polynomial counter 1 is not effectively counting, plus the generation of $2^N-1$ clock pulses during which time polynomial counter 1 progresses through all its count states and recycles, plus one additional clock pulse after which counter 2 generates an overflow signal causing the generation of the COUNT COMPLETE signal. This is expressed by the formula $T = (N + 2^N - 1 + 1)/R$, where T=time in seconds and R=the rate of oscillation of oscillator 3 in pulses per second. By way of example, therefore, for a 35 stage polynomial counter 1 and an oscillator 3 having a pulse rate of 1000 hertz per second, the COUNT COMPLETE signal is generated in 34,359,773 seconds, or approximately one year.

It is to be understood that the above described arrangement is merely illustrative of the application of the principles of the invention and that other arrangements may be devised by those skilled in the art without departing from spirit and scope of the invention.

I claim:

1. In an arrangement comprising a source of pulses (3) and a recycling polynomial counter (1) having N counting stages and $2^N-1$ counting states for counting the pulses,
  a method of determining when the polynomial counter has recycled after progressing through its $2^N-1$ counting states, CHARACTERIZED BY the steps of
  storing an indication when a prescribed one of the stages of the polynomial counter assumes a predetermined logic state,
  clearing the indication after each group of N of the pulses, and
  generating a count complete signal after the occurrence of a group N pulses and before the indication is cleared if said indication is not then stored.

2. The invention of claim 1 wherein the N stages of the polynomial counter comprise an initial stage ($Q_0$) and a plurality of other stages ($Q_1$ to $Q_N$), wherein the logic state assumed by the initial stage responsive to each of the pulses is a prescribed function of the joint logic states of predetermined ones ($Q_{N-1}, Q_N$) of the other stages at the times of occurrence of the pulses, and wherein said prescribed one of the stages is said initial stage.

3. In a circuit comprising:
  a recycling polynomial counter (1) having N counting stages and $2^N-1$ count states,
  pulsing means (3) for incrementing the polynomial counter through its count states, and
  means for detecting when the polynomial counter has recycled after progressing through each of its count states, the invention wherein said detecting means is CHARACTERIZED BY
  a recycling second counter (2) having N count states for counting pulses from the pulsing means and operative to generate an overflow signal each time the second counter recycles through its counts states, and
  logic circuit means (10 through 14) jointly responsive to the overflow signals from the second counter and to the absence of a predetermined logic state in a prescribed one ($Q_0$) of the counting stages of the polynomial counter since the last overflow signal from the second counter for generating a counting complete signal.

4. The invention of claim 3 wherein the stages of the polynomial counter comprise an initial stage ($Q_0$) and at least two other stages ($Q_{N-1}, Q_N$), and wherein the logic state assumed by the initial stage, responsive to each one of the pulses, is dependent jointly on the logic states of at least two of said other prescribed stages at the time of occurrence of each one of the pulses, and wherein said prescribed one of the stages of the polynomial counter is said initial stage.

5. The invention of claim 3 wherein said logic circuit means comprises
  storage means (12) operable to a first storage state responsive jointly to one of the pulses and to the presence of said predetermined logic state in the prescribed one of the stages of the polynomial counter, and operable to a second storage state responsive to each occurrence of the overflow signals, and
  gate means (14) operated in response to the presence of the second storage state in the storage means coincident with the occurrence of one of the overflow signals for generating the counting complete signal.

6. In a circuit comprising a source of pulses (3) and a polynomial counter (1) having N counting stages and $2^N-1$ count states for counting the pulses, the invention for determining when the polynomial counter has recycled after progressing through all of its count states, CHARACTERIZED BY
 second counter means (2) having N count states for counting the pulses,
 storage means (12),
 means (13) for storing a first indication in said storage means when a prescribed one ($Q_0$) of the stages of the polynomial counter has assumed a first predetermined logic state,
 means (10, 11) for storing a second indication in the storage means each time the second counter counts N pulses, and
 means (14) for generating a count complete signal when the second counter counts N pulses and the second indication is stored in said storage means.

7. In a circuit comprising:
 a recycling polynomial counter (1) having N counting stages and $2^N-1$ count states,
 pulsing means (3) for incrementing the polynomial counter through its count states, and
 means for detecting when the polynomial counter has recycled through its $2^N-1$ count states, the invention wherein said detecting means is CHARACTERIZED BY
 a recycling second counter (2) having N count states for counting pulses from the pulsing means and operative to generate an overflow signal each time it recycles through its N states,
 a flip-flop (12) having first and second logic states and logic state input means (D) connected to a prescribed one ($Q_0$) of the stages of the polynomial counter,
 first gate means (13) jointly responsive to the presence of the first logic state in the flip-flop and to ones of the pulses for controlling the state of the flip-flop to follow that of the prescribed stage of the polynomial counter,
 means (10, 11) responsive to the overflow signals from the second counter for operating the flip-flop to the first logic state, and
 means (14) responsive to the operating means and to the coincident presence of the second logic state in the flip-flop for generating a counting complete signal.

* * * * *